METHOD OF MAKING SHALLOW-DIFFUSED SEMICONDUCTOR REGIONS

Filed Sept. 26, 1967 2 Sheets-Sheet 1

INVENTOR.
ROBERT L. LUCE
BY
Leonard Zalman
ATTORNEY

INVENTOR.
ROBERT L. LUCE
BY
Leonard Zalman
ATTORNEY 3,506,504

METHOD OF MAKING SHALLOW-DIFFUSED SEMICONDUCTOR REGIONS

Robert L. Luce, North Wales, Pa., assignor to Philco-Ford Corporation, Philadelphia, Pa., a corporation of Delaware Filed Sept. 26, 1967, Ser. No. 670,597
Int. Cl. H01l 7/36, 7/44
U.S. Cl. 148—187 6 Claims

ABSTRACT OF THE DISCLOSURE

A process for making shallow-diffused semiconductor regions in which impurity diffsion is preceded by three separate impurity deposition steps, each deposition step being followed by an etch that removes any glass formed during the prior deposition step.

Figure 1:
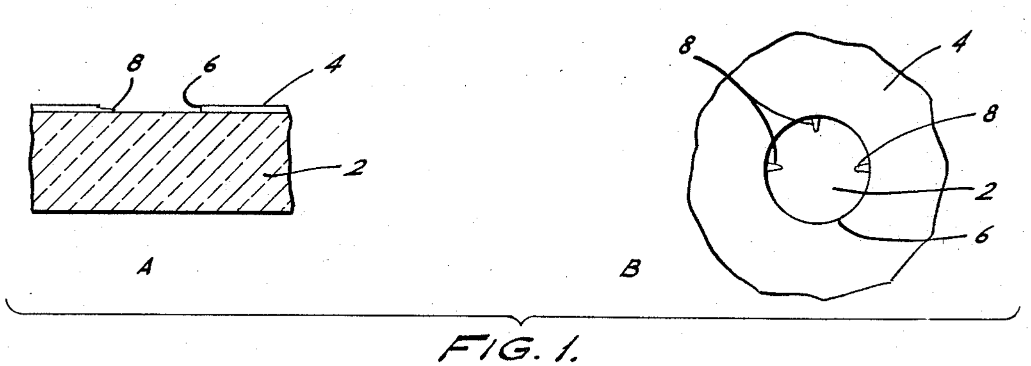

The fabrication of high-speed switching transistors requires the formation of shallow-diffused emitter regions. Generally, these emitter regions are formed by first photolithographically cutting a hole in the residual oxide layer which is formed on the surface of the semiconductor wafer during formation of the base region, followed by exposure of the wafer to an oxidizing and impurity atmosphere. Conventionally, this exposure lasts for several minutes and is conducted at a temperature of approximately 1000° C.

During the exposure, the impurity is deposited over the desired emitter region and, at the same time, a thin layer of impurity doped glass is formed over the entire wafer. Following deposition of the impurity, the wafer is cooled and the layer of glass is removed by immersing the wafer is a suitable acid solution. Next, the wafer is heated in an inert atmosphere which causes lateral and normal diffusion of the impurity into the wafer. By virtue of the lateral diffusion, the diffusion front (the emitter-base junction) moves beneath the oxide layer thereby providing a protective oxide mask for the diffusion front.

In order that good ohmic contact can be made to the diffused emitter region, a pre-metallization oxide etch is performed now to remove any oxide formed on the surface of the emitter region during diffusion of the impurity and exposure to room ambient during processing. In addition to removing any oxide formed on the surface of the emitter region, this pre-metallization etch also removes, undesirably, a thin layer of the protective oxide mask which covers the diffusion front.

Generally the process heretofore described produces a low yield of good shallow-diffused emitter regions. It is believed that the major cause of the low yield results from thin (500 angstroms) layers of photoresist material which form at the edges of this material after development thereof. These layers temporarily mask portions of the residual oxide layer and thereby cause initial non-uniform removal of the residual oxide layer. As a result of the initial non-uniform removel of the residual oxide layer, thin (500 angstroms or less) oxide layers project from the edges of the oxide cut and due to the masking effect of these thin oxide layers during the impurity deposition, these thin oxide layers may be the only protective oxide covering portions of the diffusion front after impurity diffusion. Since these layers are thin, they are often removed during the pre-metallization etch and this results in shorting of the diffusion front. Even if the thin oxide layers are not removed during the final pre-metallization etch, the etch often makes these layers so thin that the contact meal can easily penetrate imperfections in these thin oxide layers and thereby shunt the diffusion front.

It is therefore an object of the present invention to provide an improved method of producing shallow-diffused semiconductor regions.

It is a further object of the present invention to provide a process which increases the yield of shallow-diffused semiconductor regions after metallization.

It is a further object of the present invention to provide a process which increases the uniformity of shallow-diffused semiconductor regions.

In accordance with the present invention, the impurity deposition cycle is performed in multiple steps with dissolution after each deposition step of any impurity doped glass formed during that deposition step. It is believed that this repetitive deposition and dissolution process effectively removes the thin oxide layers that project from the edges of the hole in the residual oxide layer prior to the pre-metallization etch and thereby greatly reduces shorting and shunting of the diffusion front.

Preferably, deposition of the impurity is achieved by three, one-minute exposures of the proposed emitter region to an oxidizing and impurity atmosphere, each exposure being followed by immersion of the semiconductor body in an etching solution which removes any glass formed by that exposure. After the third exposure and glass removal, conventional impurity diffusion is performed for a time determined by required device properties.

The invention will be better understood from the following more detailed description, taken in conjunction with the accompanying drawings in which:

FIGURES 1A and 1B are sectional and plan views, respectively, of a semiconductor wafer as it is believed to appear prior to formation of a thin diffused region therein; and FIGS. 2 through 8 are sectional views of a portion of a semiconductor wafer which views are believed to depict seven successive stages in the production of a shallow-diffused region in accordance with the present invention.

With reference more particularly to the drawings, FIGs. 1A and 1B show a body 2 of silicon of one conductivity type having an oxide layer 4 on one surface thereof. Body 2 can be a prediffused region formed in a wafer of opposite conductivity type. Oxide layer 4 has a hole 6 therein which can be formed by conventional photoengraving techniques. It is believed that this (500 angstroms or less) finger-like oxide layers 8 project into the hole 6. As previously noted, it is believed that layers 8 result from initial non-uniform removal of the oxide layer 4 during formation of hole 6.

In accordance with the first step of the process of the present invention, the first deposition step, body 2 is inserted into a furnace (not shown) through which is flowing an oxidizing and impurity atmosphere maintained at approximately 1000° C. This atmosphere contains a significant impurity of the type opposite to that which predominates in the body 2. Any of the known significant impurities which have been found suitable for use in vapor-solid diffusion processes of the prior art can be employed in the present invention provided such impurities are capable of forming a glass by interaction with silicon or silicon dioxide. Suitable impurities are phosphorus, boron, nad antimony and a suitable atmosphere consists of oxygen, nitrogen and, when the body 2 is P-type, phosphorus oxychloride.

In accordance with the present invention, the body 2 is exposed to the atmosphere for approximately one minute. In the conventional process heretofore described, this exposure lasts for several minutes. Following the one minute exposure, body 2 is withdrawn from the furnace (not shown) and cooled.

Figure 2:
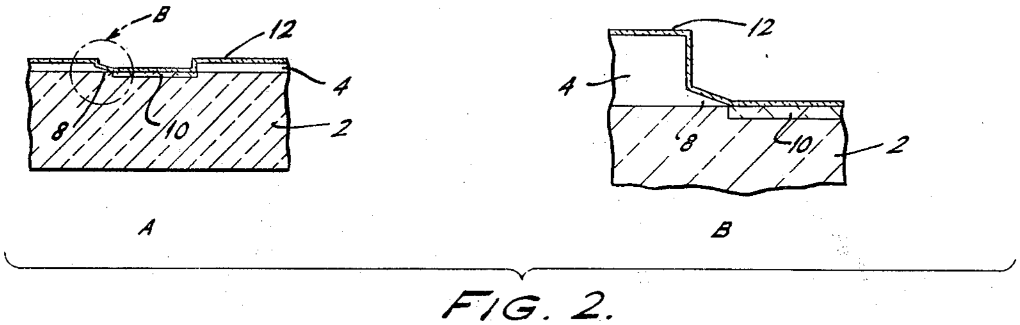

The resultant body after the first deposition step is believed to be as shown in FIG. 2. FIG. 2A is a cross-sectional view corresponding to FIG. 1A. FIG. 2B is a fragmentary, enlarged cross-sectional view of the portion of the wafer encircled in FIG. 2A. FIGS. 3–8 are similar to FIG. 2 but show the wafer after successive steps of the process. A layer 10 in which the significant impurity utilized in the oxidizing and impurity atmosphere of the first deposition step predominates is formed adjacent the surface of body 2 as shown and a layer of glass 12 is formed over layer 10. Due to chemical nad physical reactions between the oxide layers 4 and 8 and the oxidizing and impurity atmosphere, portions of the oxide layers 4 and 8, and, in particular, those portions of the layers 8 adjacent the boundaries between those layers and body 2 which are exposed to the atmosphere, form part of the layer of glass 12. It is believed that these chemical and physical reactions also enhance lateral diffusion of the impurity contained in the atmosphere and, as a result, the layer of impurity 10 extends slightly beneath layers 8.

Figure 3:
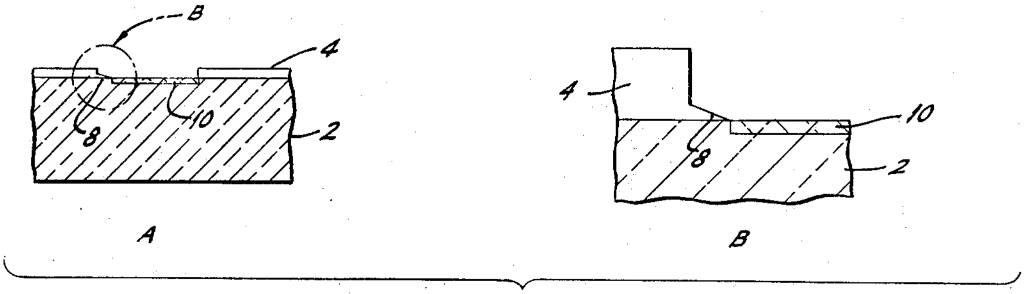

Next, the body is treated with an etchant, the first etching step, which dissolves the layer of glass 12 and leaves the silicon wafer 2 untouched. The etchant also reduces the thickness of oxide layers 4 and 8 to the extent that the layer of glass 12 has penetrated these layers. FIG. 3 depicts the body 2 after removal of the layer of glass 12. A conventional etchant for this purpose is hydrochloric acid, although any etchant which differentiates in its etching action between the wafer 2 and the unreacted oxide layers 4 and 8 on the one hand and the layer of glass 12 on the other is satisfactory. A seventy-to-one water-hydrochloric acid solution is a satisfactory etchant. As shown in FIG. 3 the first impurity deposition-glass removal cycle has reduced the thickness of the oxide layers 8 and has substantially reduced the length of the oxide layers 8.

Figure 4:
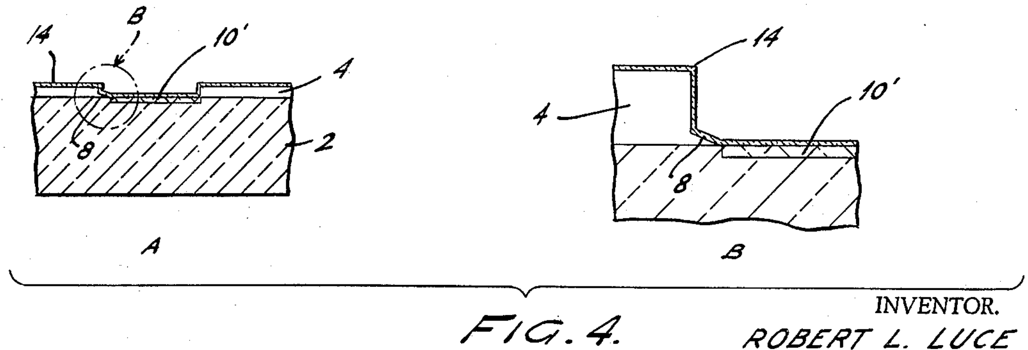

In accordance with the next step of the present invention a second deposition step, substantially identical to the first deposition step, is now performed. The body resulting from the second deposition step is believed to include a second layer of glass 14 and an impurity layer 10′ as shown in FIG. 4. Layer 10′ denotes the impurity deposited during the first and second deposition steps.

Figure 5:
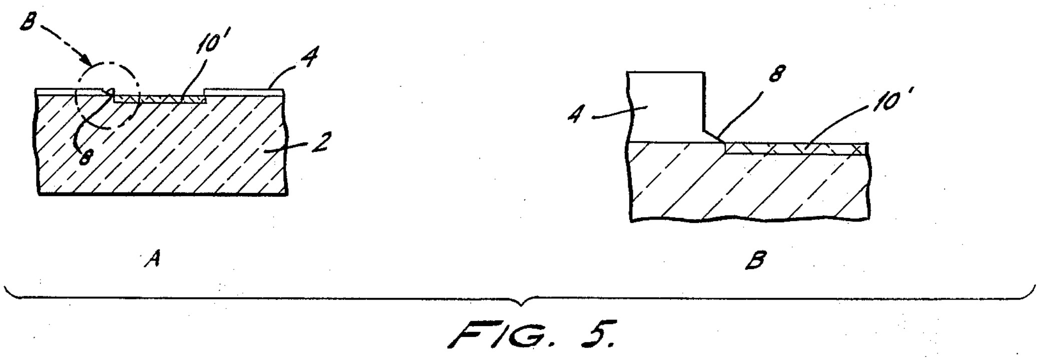

A second etching step, substantially identical to the first etching step, is now performed. This step dissolves the layer of glass 14, leaving the impurity layer 10′ substantially untouched. As shown in FIG. 5, the second impurity deposition-glass removal cycle has reduced further the thickness and length of the oxide layers 8.

Figure 6:
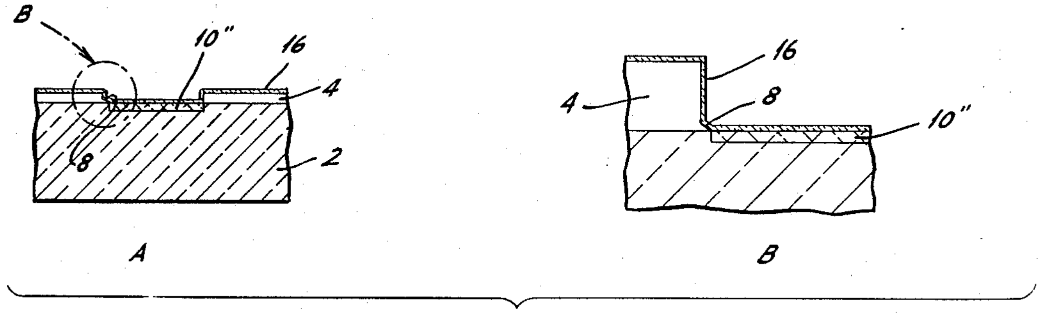
Figure 7:
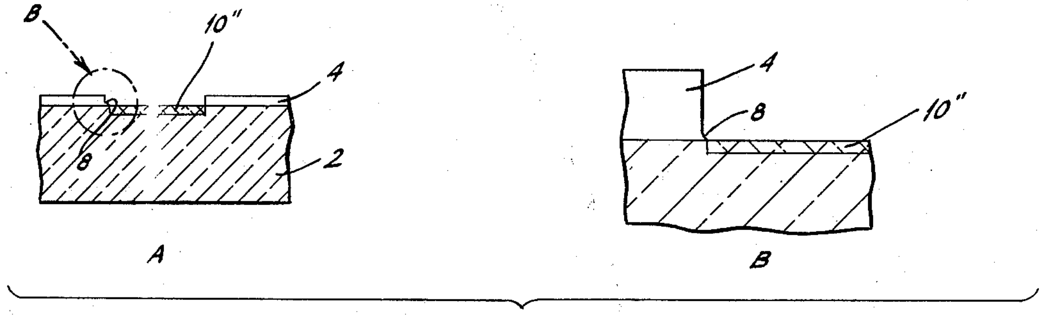

Next, a third deposition step, also substantially identical with the first deposition step, is performed. The resultant body after the third deposition step is believed to include a third layer of glass 16 and an impurity layer 10″ as shown in FIG. 6. Layer 10″ denotes the impurity deposited during the first, second and third deposition steps. A third etching step, also substantially identical with the first etching step, is now performed. This etching step dissolves the layer of glass 16, leaving the impurity layer 10″ substantially untouched. FIG. 7 depicts the body 2 after the third etching step. As shown in FIG. 7, the third impurity deposition-glass removal cycle has substantially eliminated the oxide layers 8.

The last step in the process of the present invention, the diffusion step, is accomplished by heating the processed body of FIG. 7 in an inert atmosphere at a prescribed temperature for a predetermined period of time. The diffusion time will be determined by required device properties, a period of from one to five minutes being suitable for the formation of shallow-diffused regions in silicon. The diffusion step can be conducted at a temperature in the range of 700° C. to 1300° C.; 1000° C. being a preferred temperature. The range of temperature is based on considerations relating to silicon wafers and this range will vary for other semiconductors.

The diffusion atmosphere can be an inert gas such as nitrogen, argon, or helium. However, an atmosphere containing oxygen is preferred when the diffusion step is performed at the higher temperature (above approximately 1100° C.) to insure against pitting of body 2.

Figure 8:
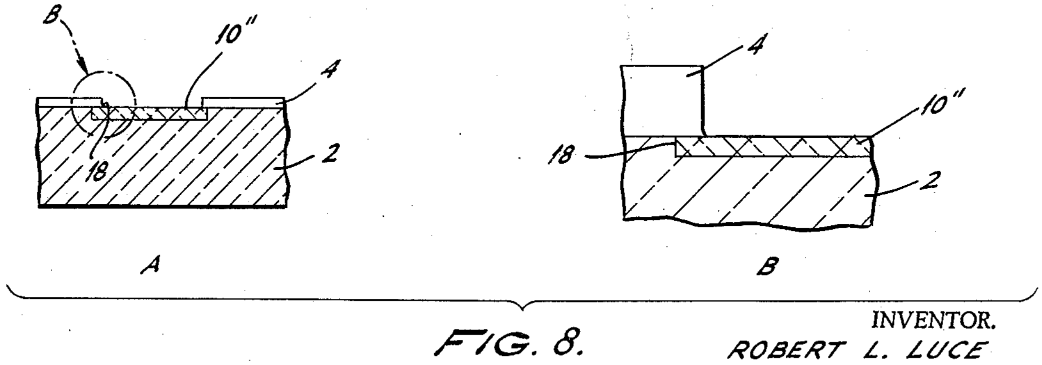

The results oft he diffusion step are shown in FIG. 8. The amount of impurity diffusion (spreading) produced by the diffusion step is directly proportional to the diffusion period and the diffusion temperature used. As shown in FIG. 8, the diffusion step has moved the diffusion front 18 of layer 10″ under a portion of the oxide layer 4 which layer is relatively thick compared to the original thickness (500 angstroms) of the layers 8. This provides more protection for the diffusion front during the subsequent contact metallization and hence greatly reduces shunting and shorting of the diffusion front.

Analysis of emitter-base diodes formed by the process of the present invention shows an increase of approximately 300% in the yield of good emitter-base diodes. Although the precise reason for the yield improvement is not known, it is believed to be the result of removal of the thin oxide layers 8 prior to metallization. However, the invention is not to be limited by this explanation of the beneficial results obtained.

A further advantage of transistors produced by the present invention, in addition to the improvement in the yield of good emitter-base diodes, is a factor of three improvement in collector-emitter voltage uniformity. Presumably, this improvement is due to increased uniformity of emitter impurity concentration resulting from the multiple deposition steps.

I claim:

1. The process of forming a shallow-diffused region of one conductivity type in a semiconductor body of the opposite conductivity type comprising exposing said wafer to an oxidizing and impurity atmosphere which contains an impurity which is opposite to the type of impurity which predominates in said body and which is capable of forming a glass with said body to thereby form an impurity layer in said body and a layer of glass on said body, removing said layer of glass, subsequently exposing said body to said atmosphere for at least one additional time to thereby increase the amount of said impurity in said impurity layer, removing any glass formed during each exposure prior to the next exposure, and heating said body in an inert atmosphere after the last glass removal step to redistribute the impurity concentration of said impurity layer.

2. The process of claim 1 in which the step of removing said layer of glass comprises immersing said body in a suitable etchant.

3. The process of claim 1 in which said body is exposed to said oxidizing and impurity atmosphere a total of three times, each exposure lasting for approximately one minute.

4. The process of claim 3 in which said layers of glass are removed by immersing said body in a suitable etchant for approximately twenty-five seconds.

5. The process of claim 4 in which said atmosphere is maintained at approximately 1000° C.

6. The process of claim 2 in which said body is P-type silicon, said oxidizing and impurity atmosphere consists of oxygen, nitrogen, and phosphorus oxychloride, and said etchant is a water-hydrochloric acid solution.

References Cited

UNITED STATES PATENTS 2,804,405 8/1957 Derick et al. -------- 148—187

L. DEWAYNE RUTLEDGE, Primary Examiner

R. A. LESTER, Assistant Examiner

U.S. Cl. X.R.

148—188

UNITED STATES PATENT OFFICE

CERTIFICATE OF CORRECTION

Patent No. 3,506,504 Dated April 14, 1970

Inventor(s) Robert L. Luce

It is certified that error appears in the above-identified patent and that said Letters Patent are hereby corrected as shown below:

Column 3, line 29, "hydrochloric" should read -- hydrofluoric --; line 34, "drochloric" should read -- drofluoric --. Column 4, line 63, "hydrochloric" should read -- hydrofluoric --.

Signed and sealed this 30th day of November 1971.

(SEAL)
Attest:

EDWARD M.FLETCHER,JR.
Attesting Officer

ROBERT GOTTSCHALK
Acting Commissioner of Patents

USCOMM-DC 60376-P69
* U.S. GOVERNMENT PRINTING OFFICE : 1969 O—366-334